United States Patent
Oguri

(10) Patent No.: US 7,674,417 B2
(45) Date of Patent: Mar. 9, 2010

(54) METHOD OF MANUFACTURING WINDOW HAVING AT LEAST ONE OF RADIO WAVE STEALTH PROPERTY AND ELECTROMAGNETIC WAVE SHIELD PROPERTY, AND WINDOW MATERIAL HAVING AT LEAST ONE OF RADIO WAVE STEALTH PROPERTY AND ELECTROMAGNETIC WAVE SHIELD PROPERTY

(75) Inventor: Kazuyuki Oguri, Aichi-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 777 days.

(21) Appl. No.: 10/946,114

(22) Filed: Sep. 22, 2004

(65) Prior Publication Data

US 2005/0170083 A1 Aug. 4, 2005

(30) Foreign Application Priority Data

Sep. 30, 2003 (JP) ............................. 2003-340497

(51) Int. Cl.
*B29C 45/00* (2006.01)
*B29D 11/00* (2006.01)
*B05D 5/06* (2006.01)

(52) U.S. Cl. .................. 264/295; 264/1.7; 264/2.7; 264/132; 264/134; 264/259; 264/263; 264/266; 264/291; 264/339; 427/108; 427/164; 427/165; 428/432

(58) Field of Classification Search ....................... None
See application file for complete search history.

(56) References Cited

U.S. PATENT DOCUMENTS

| RE25,202 | E | * | 7/1962 | Clapp et al. ................. 264/339 |
| 3,078,693 | A | * | 2/1963 | Lytle ........................... 65/60.2 |
| 3,238,909 | A | * | 3/1966 | Kendall ...................... 72/379.4 |
| 3,458,614 | A | * | 7/1969 | Knoll .......................... 264/132 |
| 3,631,580 | A | * | 1/1972 | Swartz ...................... 29/407.01 |

(Continued)

FOREIGN PATENT DOCUMENTS

CA          2 449 285          12/2002

(Continued)

OTHER PUBLICATIONS

Canadian Office Action dated Jul. 11, 2006.

(Continued)

*Primary Examiner*—Jeffrey Wollschlager
(74) *Attorney, Agent, or Firm*—Westerman, Hattori, Daniels & Adrian, LLP

(57) ABSTRACT

There is provided a method of manufacturing a window having at least one of a radio wave stealth property and an electromagnetic wave shield property comprising: a step for forming a thin-film composed of a conductive material on the surface of a transparent window member having a curved surface, and a step for forming the thin-film into a mesh shape. As a result, it is possible to manufacture, at lower cost, a window having a radio wave stealth property that scatters radio waves in various directions so as not to be detected by radar, while transparency to visible light is improved, as well as a window having an electromagnetic wave shield property that effectively prevents harmful electromagnetic waves, except for visible radiation, from invasion into an aircraft.

4 Claims, 8 Drawing Sheets

U.S. PATENT DOCUMENTS

| | | | |
|---|---|---|---|
| 4,361,527 A * | 11/1982 | Rau | 264/481 |
| 4,678,699 A * | 7/1987 | Kritchevsky et al. | 428/175 |
| 4,772,760 A * | 9/1988 | Graham | 174/389 |
| 4,845,310 A * | 7/1989 | Postupack | 174/389 |
| 4,932,755 A * | 6/1990 | Holdridge et al. | 359/896 |
| 5,143,793 A * | 9/1992 | Masse et al. | 428/577 |
| 5,165,965 A * | 11/1992 | Martin | 427/256 |
| 5,194,985 A * | 3/1993 | Hilton, Sr. | 359/350 |
| 5,253,175 A * | 10/1993 | Machii et al. | 700/117 |
| 5,470,413 A * | 11/1995 | Cedarleaf | 156/90 |
| 5,670,742 A * | 9/1997 | Jones | 174/384 |
| 5,776,612 A | 7/1998 | Fisher | |
| 5,876,577 A * | 3/1999 | McAleer et al. | 205/777.5 |
| 5,876,789 A | 3/1999 | Nakada | |
| 6,028,699 A * | 2/2000 | Fisher | 359/360 |
| 6,399,879 B1 * | 6/2002 | Ueda et al. | 174/389 |
| 6,544,634 B1 * | 4/2003 | Abrams et al. | 428/212 |
| 6,560,050 B2 * | 5/2003 | Casteleiro et al. | 359/894 |
| 2002/0051870 A1 | 5/2002 | Honjo et al. | |
| 2003/0087048 A1 | 5/2003 | Chaussade et al. | |

FOREIGN PATENT DOCUMENTS

| | | |
|---|---|---|
| DE | 297 18 134 U1 | 3/1998 |
| EP | 0 867 733 A | 9/1998 |
| JP | 04 030608 A | 2/1992 |
| JP | 11 055031 A | 2/1999 |
| JP | 2001-189589 | 7/2001 |
| JP | 2002-059737 A | 2/2002 |
| JP | 2002 118391 | 4/2002 |
| JP | 2003-023289 A | 1/2003 |
| JP | 2003-523911 A | 8/2003 |

OTHER PUBLICATIONS

Japanese Office Action dated Feb. 10, 2009 issued in corresponding Japanese Patent Application No. 2003-340497.

* cited by examiner

METHOD OF MANUFACTURING WINDOW HAVING AT LEAST ONE OF RADIO WAVE STEALTH PROPERTY AND ELECTROMAGNETIC WAVE SHIELD PROPERTY, AND WINDOW MATERIAL HAVING AT LEAST ONE OF RADIO WAVE STEALTH PROPERTY AND ELECTROMAGNETIC WAVE SHIELD PROPERTY

BACKGROUND OF THE INVENTION

1. Field of the Invention

The present invention relates to a method of manufacturing a window having at least one of a radio wave stealth property and an electromagnetic wave shield property that is applicable to aircraft or the like, in particular to stealth aircraft, and to a window material having at least one of a radio wave stealth property and an electromagnetic wave shield property.

This application is based on patent application No. 2003-340497 filed in Japan, the content of which is incorporated herein by reference.

2. Description of Related Art

In the past, a window member composed of a transparent resin or inorganic glass with a transparent conducting film such as gold or ITO (indium tin oxide) coated thereon, as an electromagnetic wave shield window used for aircraft, in particular for stealth aircraft, is known. Applying such transparent conducting film enables, while maintaining transparency to visible radiation, both a radio wave stealth property which scatters radio waves in various directions so as not to be detected by radar, and an electromagnetic wave shield property which prevents harmful electromagnetic waves, except for visible radiation, from invasion into an aircraft.

However, in many cases, such window members for aircraft, especially windshields and canopies are bent at a large curvature and have a multiple curved surface shape, having a plurality of radius of curvature. Therefore there is a problem in that it is difficult to coat a transparent conducting film on a window member in a uniform thickness.

There is yet another problem in that as the radio wave stealth property or the electromagnetic wave shield property is increased, the transparency to visible radiation is reduced. In particular, to achieve an adequate radio wave stealth property or electromagnetic wave shield property with a transparent conducting film, the transmissivity of visible radiation drops to 70% or lower, which causes a problem in that the view from the aircraft is darkened.

Furthermore, a window having at least one of a radio wave stealth property and a electromagnetic wave shield property, comprising a window member coated with a transparent conducting film, is exposed to a wide range variation in outside pressure and temperature during flight and the window member deforms.

However, the transparent conducting film, especially ceramic transparent conducting film such as ITO does not deform sufficiently to follow the deformation of the window material. Therefore the transparent conducting film might crack even with relatively little deformation, which can occur during an actual flight. To prevent such cracking, especially ceramic transparent conducting film such as ITO is coated on the inner side of the windows, which deform relatively less.

On the other hand, a front filter applied to a plasma display panel, which is in a totally different field of art compared to aircraft windows, is known as a device to shield harmful electromagnetic waves and let only visible radiation go through.

For example, in Japanese Unexamined Patent Application, First Publication No. 2001-189589 (from paragraph [0003] to [0004] and FIG. 3) there is disclosed a front filter of a construction where a resin film of for example PET (polyethylene terephthalate) formed with a conductive mesh thereon, is adhered integrally so as to cover the whole front side of a plasma display panel.

However, such a front filter is essentially flat because it is supposed to be applied to a plasma display panel. Therefore, it is difficult to apply such a front filter to a window having a multiple curved surface shape such as for an aircraft canopy.

BRIEF SUMMARY OF THE INVENTION

The present invention takes into account the above problems with an object of; providing a method of manufacturing a window having at least one of a radio wave stealth property and an electromagnetic wave shield property, that enables manufacture, at lower cost, a window having a radio wave stealth property that scatters radio waves in various directions so as not to be detected by radar, while transparency to visible light is improved, as well as a window having an electromagnetic wave shield property that effectively prevents harmful electromagnetic waves, except for visible radiation, from invasion into an aircraft, and providing a window material having at least one of a radio wave stealth property and an electromagnetic wave shield property.

To solve the abovementioned problems, the present invention provides the following means.

That is, a first aspect of the present invention is a method of manufacturing a window having at least one of a radio wave stealth property and an electromagnetic wave shield property comprising: a step for forming a thin-film composed of a conductive material on the surface of a transparent window member having a curved surface, and a step for forming the thin-film into a mesh shape.

According to the first aspect of the present invention, on the surface of a transparent window member that is formed into a curved-shape beforehand, is formed the thin-film composed of the conductive material, by using for example, a coating method such as plating or metallic vapor deposition or the like. In this case, since the fine mesh is formed by a photo-etching method in a subsequent process, there is not such sensitivity to non-uniformity of the thin-film such as uneven thickness after the coating, as in the case of coating with a transparent conductive film. Then, the thin-film, composed of a conductive material and adhered firmly on the surface of the window member, is formed into a mesh shape by, for example, a photo-etching method or the like. Thus, it is possible to form a mesh shape of a uniform density regardless of there being a complicated curved surface.

A second aspect of the present invention is a method of manufacturing a window having at least one of a radio wave stealth property and an electromagnetic wave shield property comprising: a step for forming a mesh-shaped-thin-film composed of a conductive material on the surface of a flat-shaped transparent window member, and a step for integrally bending the window member and the-thin film, and forming into a curved shape.

a third aspect of the present invention is a method of manufacturing a window having at least one of a radio wave stealth property and an electromagnetic wave shield property comprising: a step for forming a mesh-shaped-thin-film composed of a conductive material on the surface of a transparent window member having a single curved surface shape, and a step for integrally bending the window member and the thin-film, and forming into multiple curved surface shape.

According to the second and the third aspects of the present invention, the mesh-shaped-thin-film composed of a conductive material is formed beforehand on the surface of a transparent window member that is a flat-shaped or has a single curved surface shape. Therefore, according to these aspects, because the window member has a flat or single curved surface shape, by positioning a resin film or a sheet, on which the mesh-shaped-thin-film is formed, along the surface of the window member, the resin film or sheet can be adhered to the surface without a wrinkle. In addition, even if formed by the thin-film method, the thin film can be relatively easily formed into a uniform thickness. Moreover, because the thin-film is formed into a mesh shape, the thin-film deforms when being bent by allowing each mesh line to lengthen individually, making the mesh gaps wider. As a result., the thin-film, follows the expansion of the surface of the window member when being bent, and deforms to maintain firm contact with the window member. Therefore, it is possible to manufacture windows having at least one of a radio wave stealth property and an electromagnetic wave shield property, comprising a window member and mesh-shaped-thin-film on the surface thereof, which is integrally and firmly contacted with the window member even after bending.

In this case, it is more effective that, in the step for forming a mesh-shaped-thin-film, the thin film positioned in an area where a change amount in curvature is higher in a subsequent bending step, is formed with a finer mesh.

It is possible to constitute the thin-film which is formed on the surface of the window member after being bent, into a uniform mesh shape by adjusting the density of the mesh of the thin-film formed on the surface of the window member before being bent, to conform to the variation amount of the curvature of the window member to be bent. In other words, for the thin-film that is positioned at an area of the window member where the change in the curvature is greater, by forming a finer mesh size than for other areas, the mesh lines of the area expands to a mesh size of a density equivalent to those of other areas, after the window member is bent. As a result, a mesh-shaped-thin-film having a uniform mesh size is formed.

Moreover, in the step for forming a mesh-shaped-thin-film, the thin film positioned in an area with a large change amount in curvature in a subsequent bending step, may be formed with a thicker mesh line.

By adjusting the thickness of the mesh lines of the thin film formed on the surface of the window member before being bent, to conform to the variation amount of the curvature of the window member to be bent, an effect similar to the above is obtained. In other words, for the thin-film that is positioned at an area of the window member where the change in the curvature is greater, by forming a finer mesh size than for other areas, the mesh lines of that area will expand to a thinner size equivalent to those of other areas after the window member is bent. As a result, a mesh-shaped-thin-film having uniform mesh size is formed.

Furthermore, the present invention provides a window material having at least one of a radio wave stealth property and an electromagnetic wave shield property comprising a thin-film, which is formed on the surface of a transparent window member having a flat or single curved surface shape, composed of a conductive material that has a finer mesh in an area where a change amount in curvature is higher when being bent.

Furthermore, the present invention provides a window material having at least one of a radio wave stealth property and an electromagnetic wave shield property comprising a thin-film, which is formed on the surface of a transparent window member having a flat or single curved surface shape, composed of a conductive material that has a thicker mesh line in an area where a change amount in curvature is higher when being bent.

According to these window materials, in the state before being bent, by providing the thin-film composed of a conductive material of a mesh shape of finer mesh size or a thicker mesh line, at a region where the change amount in curvature is higher when being bent, it becomes possible to easily construct windows having at least one of a radio wave stealth property and an electromagnetic wave shield property comprising a thin film composed of a conductive material of a mesh-shape formed uniformly on the whole window, by simply bending the window.

According to the present invention, there is the effect that it is possible to manufacture an electromagnetic wave shield window that has a bright view, advanced radio wave stealth property, and superior shielding properties against harmful electromagnetic waves. In addition, by using metal as its material, the mesh-shaped-thin-film can deform easily following the deformation of the window member.

DETAILED DESCRIPTION OF THE INVENTION

Embodiments of a method of manufacturing a window having at least one of a radio wave stealth property and an electromagnetic wave shield property (hereunder "electromagnetic wave shield window") according to the present invention will be described hereunder with reference to the drawings.

1. First Embodiment

Figure 1:
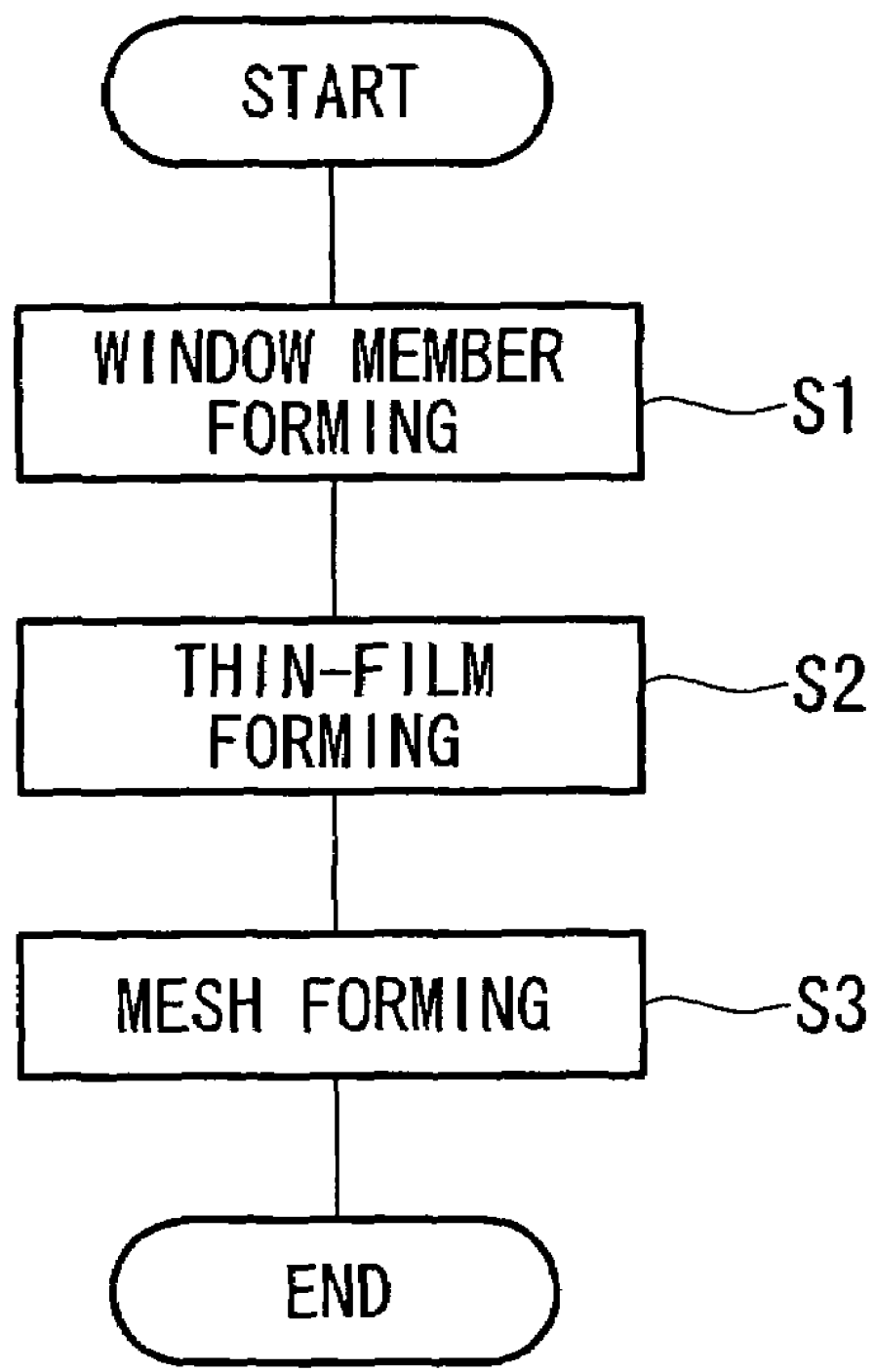
FIG. 1 is a flow chart showing a method of manufacturing windows having at least one of a radio wave stealth property and an electromagnetic wave shield property according to a first embodiment of the present invention.

A method of manufacturing an electromagnetic wave shield window of a first embodiment of the present invention is a method of manufacturing an electromagnetic wave shield window having a plurality of curved areas such as an aircraft canopy, comprising as shown in FIG. 1; a window member forming step S1 in which a transparent window member having a plurality of curved areas is formed, a thin-film forming step S2 in which a thin-film composed of a conductive material is formed on the surface of the formed window member having a plurality of curved areas, and a mesh forming step S3 in which the formed thin-film is formed into a mesh shape.

The window member forming step S1 is a step for heating a flat window material made for example from a stretch acrylic resin for aircraft, and press forming between metal dies.

Figure 2A:
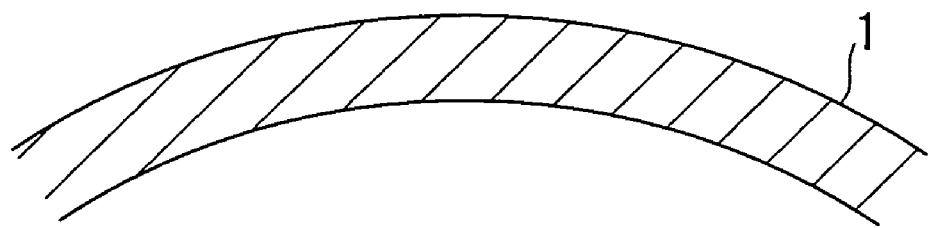
FIGS. 2A to 2C are process drawings showing respective steps in the manufacturing method in FIG. 1, by means of partial sectional views.
Figure 2B:
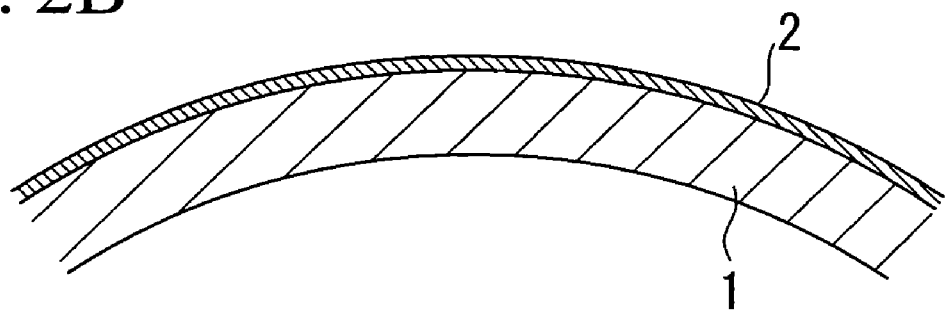

The thin-film forming step S2 is a step for forming by a plating process a thin-film 2 as shown in FIG. 2B composed of a conductive material such as metal, for example, gold, silver, copper, aluminum, nickel, titanium, or tin, on the surface of a window member 1, which is formed in a multiple curved surface shape as shown in FIG. 2A. The thickness of the thin-film 2 is preferably, for example, 1 to 30 μm, particularly 1 to 20 μm, and more preferably about 10 μm.

Figure 2C:
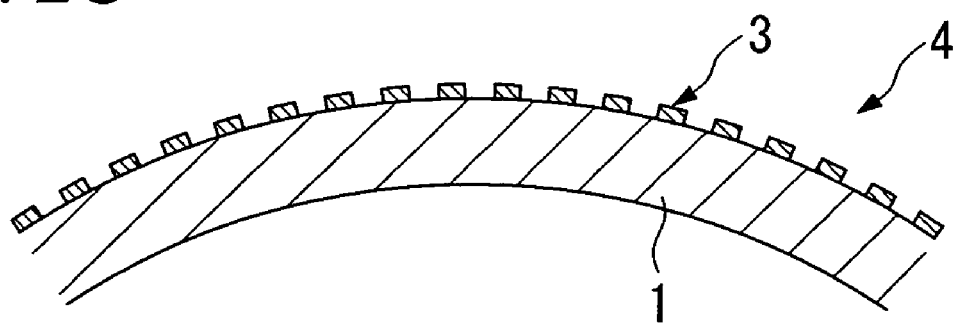

In the mesh forming step S3, the thin-film 2 which is formed on the whole surface of the window member 1, is formed into a mesh-shape-thin-film 3 as shown in FIG. 2C. More specifically, a resist film is formed on the surface of the thin-film 2. Then, a mask pattern on the resist film is exposed, after which this is developed to thereby form a mesh shape mask on the surface of the thin-film 2. By etching the thin-film 2 in this state with chemicals, the thin-film 2 is formed into the mesh-shaped-thin-film 3. Afterward, by removing the resist film, an electromagnetic wave shield window 4, which has the mesh-shape-thin-film 3 formed on the surface of the window member 1 is manufactured.

The formed mesh-shape-thin-film 3 is preferably about 10 μm in thickness, respective lines constituting the mesh are about 10 μm wide, and a gap between the respective lines is about 200 μm wide. By constructing in this way, about 90% transparency can be achieved. In addition, by constructing the thin-film 3 from a highly conductive material such as copper, it is possible to keep the electrical resistivity to less than a few ohms per square, thus realizing a high electromagnetic wave shield property or a radio wave stealth property.

According to the method of manufacturing the electromagnetic wave shield window 4 according to the present embodiment including such steps, the thin-film 2 composed of a conductive material is formed on the surface of the window member 1, which is beforehand formed into a shape having a multi-curved surfaces, after which the formed thin-film 2 is re-formed into the mesh-shaped-thin-film 3. Therefore, it is possible to form the uniform mesh-shaped-thin-film 3 on the whole surface of the window member 1, which has a complicated curved surface shape. Consequently, it is possible to avoid non-uniformity in shielding electromagnetic waves, and partial loss of view, which could be caused if the thin-film 3 were not formed uniformly. As a result, when applied to an aircraft, it is possible to manufacture an electromagnetic wave shield window 4 which can shield electromagnetic waves coming from outside the aircraft while maintaining a good view from inside the aircraft. In addition, there is the effect that the uniformly formed mesh-shaped-thin-film 3 can scatter electromagnetic waves uniformly making it possible to manufacture a window 4 which has improved radio stealth properties against outside radar.

Furthermore, compared to the conventional transparent conductive film which covers the whole of the window member 1 without a gap, the thin-film 3 which covers the surface of the window member 1, is formed into a mesh shape having a plurality of meshes. Therefore, by using metal as the material constituting the thin-film 3, the thin-film 3 can easily deform following the deformation of the window member, even when changes occur in the external environment outside of an aircraft, such as temperature or pressure changes. As a result, an electromagnetic wave shield window 4 having a radio wave stealth property and an electromagnetic wave shield property manufactured by the manufacturing method of the present embodiment, is maintained in a good condition without the occurrence of mesh cracking or exfoliation due to changes in the external environment.

Moreover, the mesh-shaped-thin-film 3 can be applied to the outer side of the window member 1 where environmental variations are greater so that deformation of the material is large. Hence, a step difference between the outer surface of the aircraft and the thin-film 3 is prevented, and radio stealth properties can be further improved.

In the embodiment above, a method of plating the surface of the window member 1 with a metallic material is shown as an example of the thin-film forming step S1. However, the method is not limited to this, and any method such as vacuum evaporation of a conductive material such as with CVD (chemical vapor deposition) or PVD (plasma vapor deposition), or applying a conductive paint or paste, may be adopted.

Figure 3:
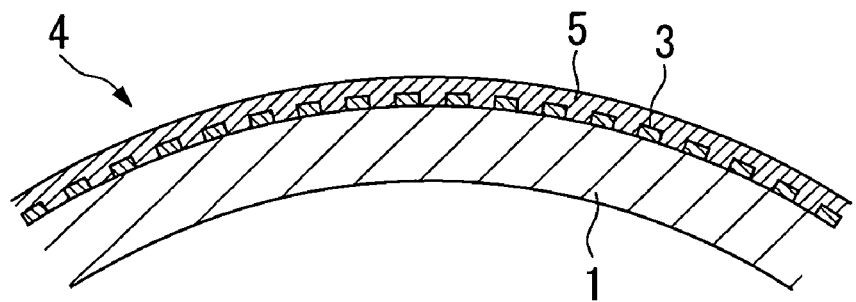
FIG. 3 is a partial sectional view showing a window manufactured by the method in FIG. 1 on which a protective layer is added.

Also, the electromagnetic wave shield window 4 comprising the window member 1 and the mesh-shaped-thin-film 3 is explained above. However, as shown in FIG. 3, an optional protection layer 5 for protecting the thin-film 3 may also be formed. As the protection layer 5, polysilazane, polyurethane, polysilicone, or siloxane resins can be used. The protection layer 5 may be formed to cover the mesh-shaped-thin-film 3 by any method such as a film application method or a coating method, after forming the mesh-shaped-thin-film 3.

2. Second Embodiment

Next, a method of manufacturing an electromagnetic wave shield window according to a second embodiment of the present invention is explained below.

Figure 4:
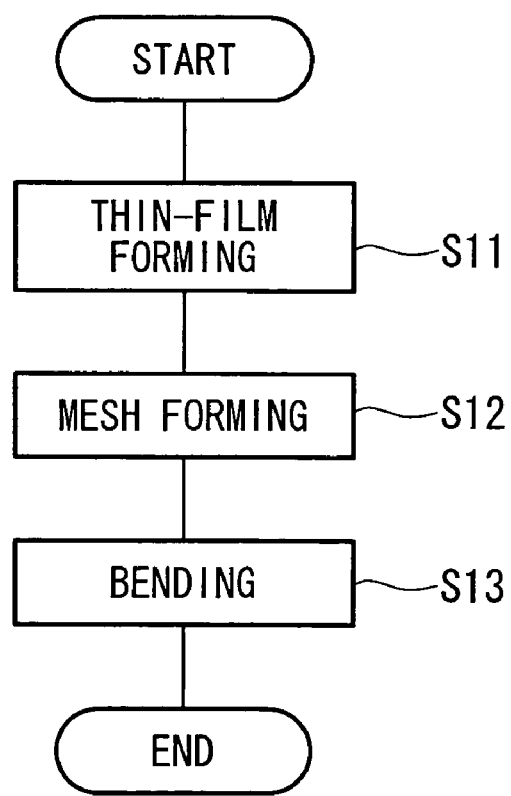
FIG. 4 is a flow chart showing a method of manufacturing a window having at least one of a radio wave stealth property and an electromagnetic wave shield property according to a second embodiment of the present invention.

The method of making an electromagnetic wave shield window, comprises as shown in FIG. 4: a thin-film forming step S11 for contact forming on the surface of a flatly-arranged transparent window member, a transparent resin film or sheet formed with a thin-film composed of a conductive material; a mesh forming step S12 for forming the formed thin-film into a mesh shape; and a bending step S13 for integrally bending the window member and the mesh-shaped-thin-film.

In the thin-film forming step S11, a thin-film composed of a conductive material is formed in the same way as in the first embodiment, on one face of the surface of the flatly-arranged transparent resin film 10.

Also, in the mesh forming step S12, the thin-film formed on the film 10 is formed into mesh-shaped-thin-film 11 in the same way as in the first embodiment. As a result, a mesh film 12 which has the mesh-shaped-thin-film 11 composed of a conductive material adhered firmly on the transparent resin film 10, is manufactured. Instead of the transparent resin film, a transparent resin sheet can be used.

Figure 5A:
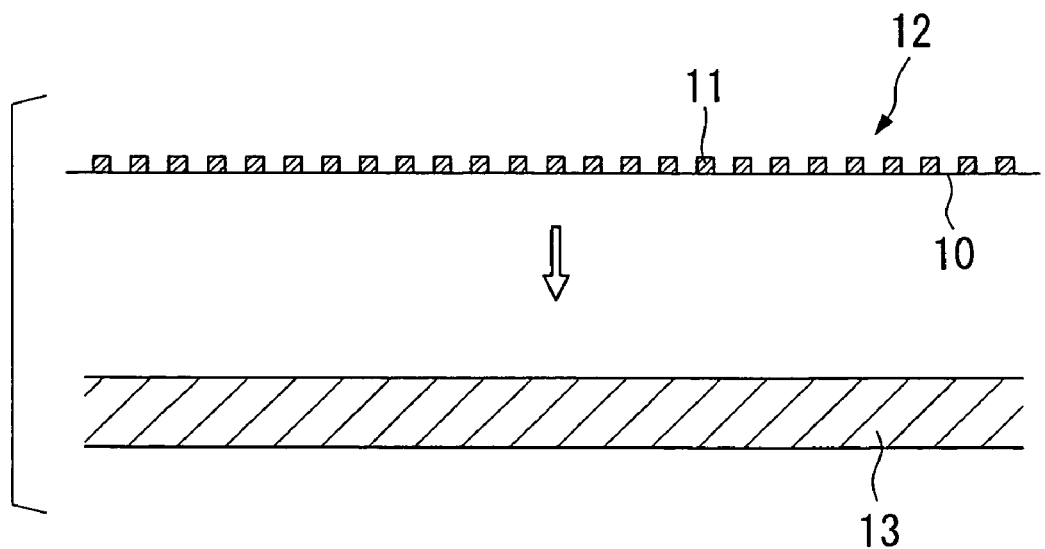
FIG. 5A to 5C are process drawings showing respective steps in the manufacturing method in FIG. 4, by means of partial sectional views.
Figure 5B:
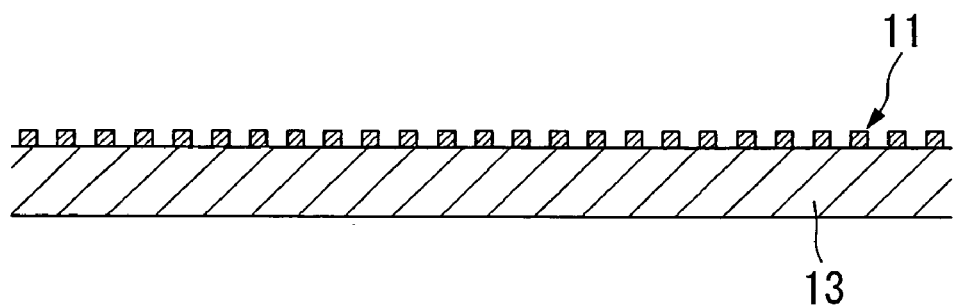

In the bending step S13, as shown in FIG. 5A, firstly by adhering the mesh film 12 formed in steps S11 and S12, on the surface of the flat-shape window member 13, then as shown in FIG. 5B, the mesh-shaped-thin-film 11 is provided on the surface of the window member 13.

The window member 13 comprises, for example, an elastic transparent flat-shape stretch acrylic resin. The mesh film 12 comprises copper for example, and is manufactured such that respective lines of the mesh are about 10 μm in width, about 10 μm in thickness, and a gap between the lines is about 200 μm. As an adhesive, a film-shaped transparent adhesive such as an EVA (ethylene vinyl acetate) with a silane coupler added, or the like may be used.

Figure 5C:
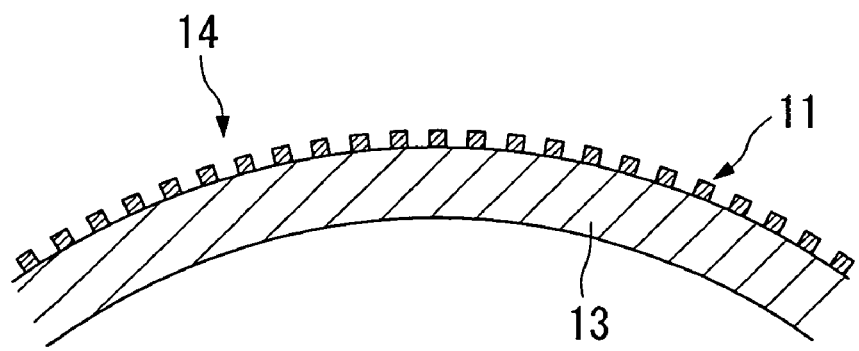

Next, in the bending step S13, as shown in FIG. 5C, the window member 13 and the mesh film 12 which are adhered integrally by the adhesive to constitute the window material, are bent at the same time and integrally. As a bending method, for example, press-forming can be adopted. Thus, an electromagnetic wave shield window 14 having at least one of a radio wave stealth property and an electromagnetic wave shield property is manufactured.

According to the method of manufacturing the electromagnetic wave shield window 14 according the present embodiment, the mesh film 12, comprising the transparent resin film 10 and the mesh-shaped-thin-film 11 formed thereon, is adhered to the flat-shaped window member 13 before the window member 13 is bent. Therefore, when being adhered, the mesh film 12 can be easily adhered firmly to the whole area of the window member 13. Then afterwards, the mesh film 12 and the window member 13 integrally bent in an integrally adhered condition. Hence it is possible to avoid the occurrence of wrinkles which that are produced when adhering a transparent conductive film to a curved surface of a window member.

Especially, since the mesh film 12 is adopted, the mesh-shaped-thin-film 11 and the transparent resin film 10 deform to conform to the expansion and contraction of the surface produced when the window member 13 is bent. Regarding the mesh-shaped-thin-film 11 which constitutes the mesh film 12, the respective metallic lines of the mesh expand and contract, and the film 10 deforms elastically, so that this deforms while maintaining close contact with the surface of the window member 13.

Therefore, an electromagnetic wave shield window 14 having at least one of a radio wave stealth property and an electromagnetic wave shield property, and which comprises a mesh-shaped-thin-film 11 formed uniformly on the curved surface of the window member 13 without wrinkles even after being bent, can be manufactured.

Thus, the electromagnetic wave shield window 14 manufactured in the above manner by the manufacturing method of the present embodiment, can also shield electromagnetic waves coming from outside an aircraft while avoiding non-uniformity of shielding of electromagnetic waves and partial loss of view, which could be caused if the mesh-shaped-thin-film 11 was not formed uniformly, and while maintaining a good view from inside the aircraft, similarly to the electromagnetic wave shield window 4 manufactured by the method of the first embodiment. In addition, the uniformly-formed mesh-shaped-thin-film 11 makes it possible to scatter electromagnetic waves uniformly, with the effect that the radio stealth properties against outside radar can be improved. Furthermore, even when the window member deforms due to changes in the external environment, it is possible to absorb stresses and maintain a good condition by using the metallic mesh-shaped-thin-film 11.

In the above embodiment the mesh film 12 is adhered to the flat-shaped window member 13. However, instead the mesh film 12 may be adhered to the window member 1 having a single curved surface shape. With a single curved surface shape, it is possible to adhere the mesh film 12 to the window member 1 firmly without wrinkles by simply bending the mesh film 12. Therefore there is a similar effect to the above embodiment.

Furthermore, as the adhesive, a film shaped adhesive comprising an EVA resin with a silane coupling agent is given as an example. However, instead of this, an optional adhesive such as epoxy resin or acrylic resin may be employed.

Figure 6A:
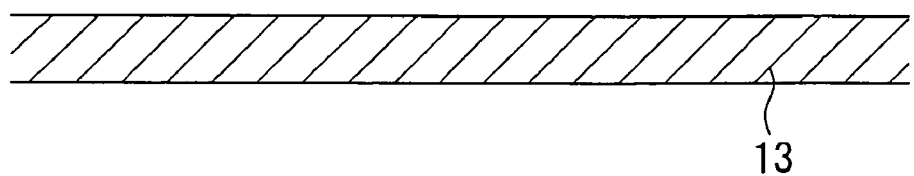
FIG. 6A to 6D are process drawings showing a modified example of FIG. 5.
Figure 6B:
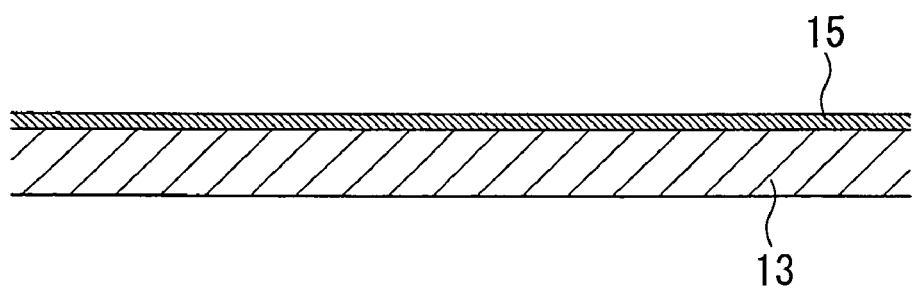
Figure 6C:
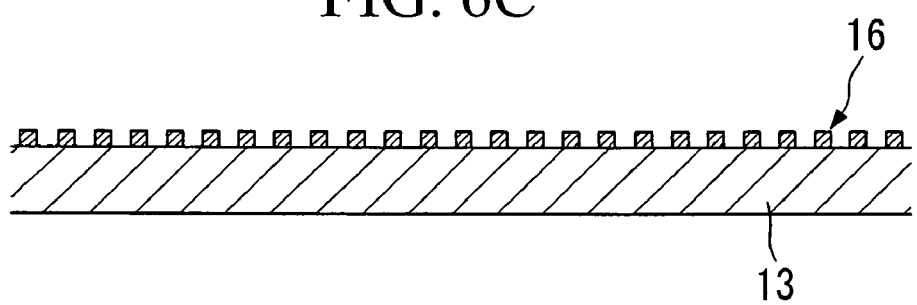
Figure 6D:
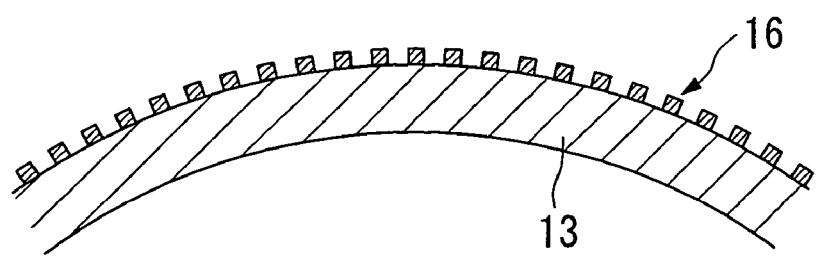

Moreover, instead of the method of adhering the mesh film 12 to the window member 13, a method shown in FIGS. 6A to 6D may be employed. In other words, a method may be employed where, on the window member 13 shown in FIG. 6A, a thin-film 15 composed of a conductive material is formed by a thin-film method as shown in FIG. 6B, after which, as shown in FIG. 6C, a mesh-shaped-thin-film 16 is formed by a photo-etching method or the like, and the window member 13 and the thin-film 16 are then bent integrally as shown in FIG. 6D.

In addition, as the method of integrally bending the window member 13 and the mesh-shaped-thin-film 11, the press-forming method was adopted. However, any method, such as a vacuum-forming method, an air pressure forming method or the like can be employed.

Moreover, the protection layer may be formed by any method. Specifically, the protection layer can be formed by either a method of forming before bending or a method of forming after bending.

3. Third Embodiment

Next, a method of manufacturing an electromagnetic wave shield window of a third embodiment of the present invention is explained below referring to the drawings.

The manufacturing method according to this embodiment, is similar to the manufacturing method according to the second embodiment. However this differs in the mesh film to be utilized. In the explanation of the present embodiment, the same reference symbols are used for components common to those in the above embodiments and their explanations are omitted.

Figure 7:
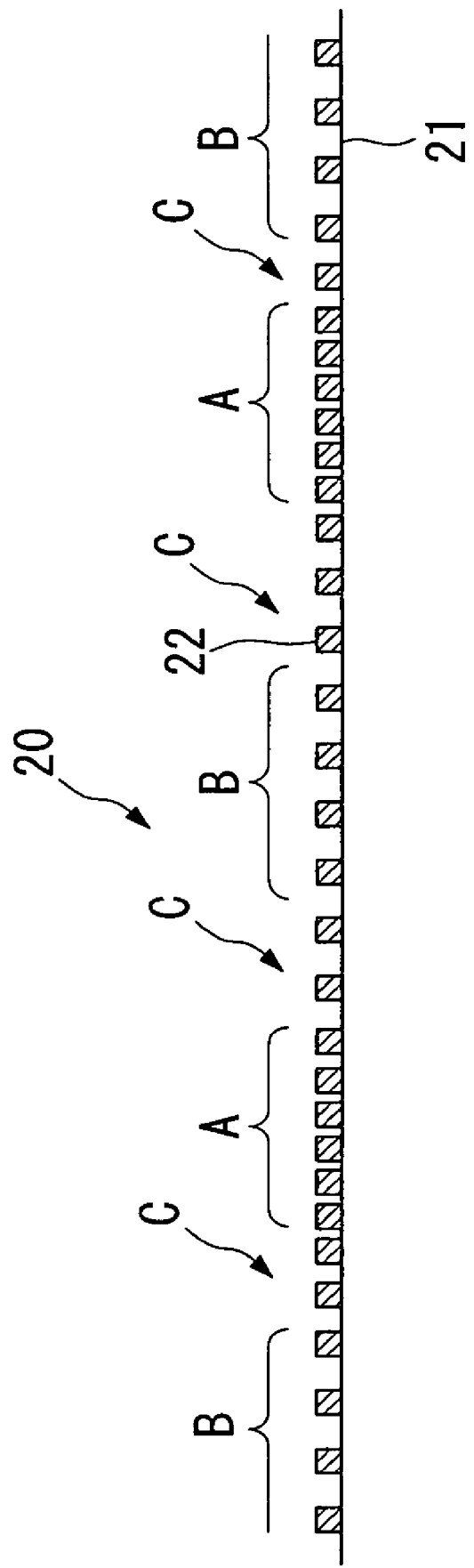
FIG. 7 is a partial sectional view of a mesh film applied to a window having at least one of a radio wave stealth property and an electromagnetic wave shield property according to a third embodiment of the present invention.

A mesh film 20, which is utilized in the manufacturing method according to the present embodiment, is one where a mesh-shaped-thin-film 22 is formed on a transparent resin film 21. For example as shown in FIG. 7, the mesh-shaped-thin-film 22 has a mesh shape that has different mesh densities depending on their positions. In the example shown in FIG. 7, the construction is such that the mesh density is highest at areas A, the mesh density is the lowest at areas B, and at areas C between these the mesh density gradually varies. The areas A with the highest mesh density, are areas that are adhered to the window member 13 where the curvature changes the most when being bent in the bending step S13. The areas B with the lowest mesh density, are areas that are adhered to the window member 13 where the curvature changes the least.

Figure 8A:
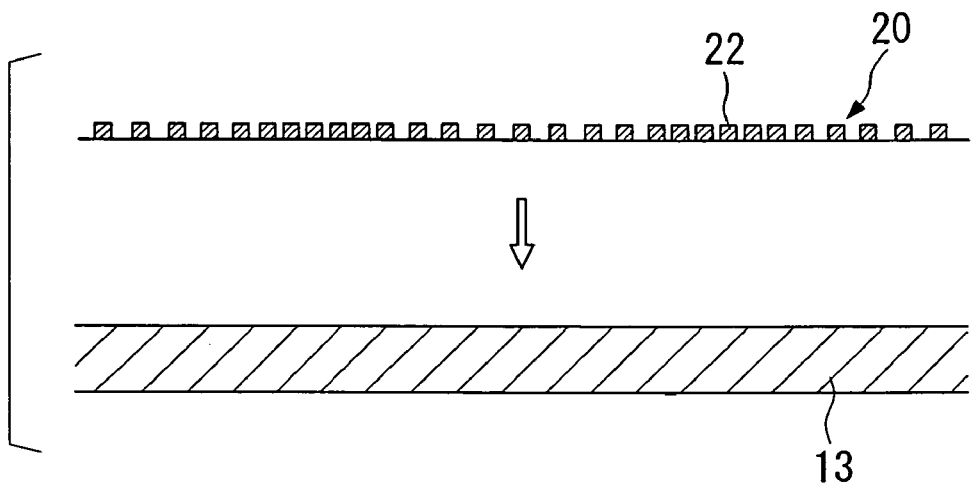
FIG. 8A to 8C are process drawings showing by means of partial sectional views, respective steps in a method of manufacturing a window having at least one of a radio wave stealth property and an electromagnetic wave shield property, using the mesh film shown in FIG. 7.
Figure 8B:
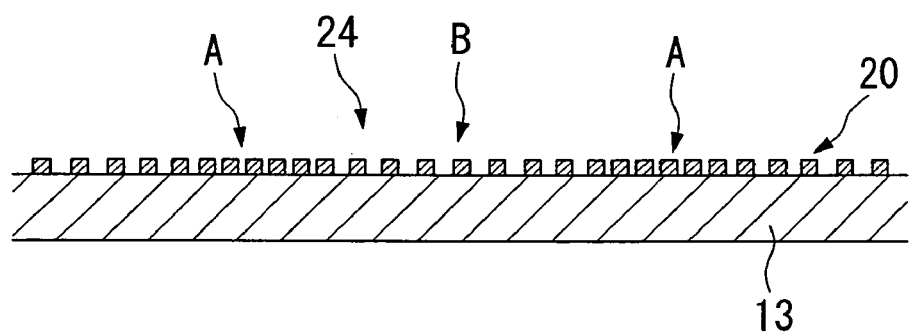
Figure 8C:
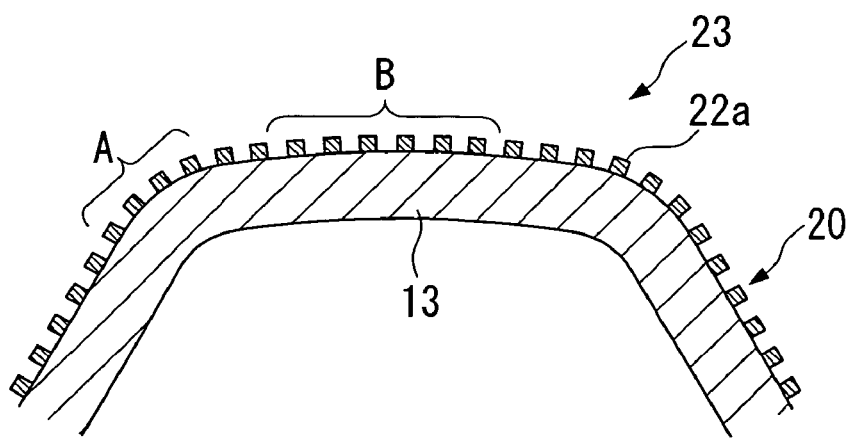

In the method of manufacturing an electromagnetic wave shield window 23 according to the present embodiment, as shown in FIG. 8A, the mesh film 20 is adhered to the flat-shaped window member 13, and as shown in FIG. 8B, an electromagnetic wave shield window material 24 with the window member 13 and the mesh film 20 adhered firmly to the surface of the window member 13 is manufacture. Then as shown in FIG. 8C, the window member 13 and the mesh film 20 which constitute the electromagnetic wave shield window material 24, are bent integrally.

According to this method, when the window member 13 and the mesh film 20, which are adhered integrally, are processed in the bending step S13, the portions of the window member 13 positioned at the areas A, are bent with a large change in curvature. At this time, the surface of the window member 13 in the areas A expands with bending. Moreover the mesh-shaped-thin-film 22 which is adhered to the surface of the window member 13 also deforms to expand widely on places where the surface of the window member 13 expands widely, and to expand less widely on places where the surface of the window member 13 expands less widely.

In this case, according to the manufacturing method according to the present embodiment, regarding the mesh-shaped-thin-film 22 that is positioned at the areas A where the expansion of the surface of the window member 13 is greatest, the respective mesh lines 22a constituting the mesh-shaped-thin-film 22 are stretched and deformed the most so as to widen the mesh size. Since the mesh film 20 positioned at the areas A has a finer mesh size than anywhere else, then due to the large deformation this becomes equivalent to the mesh size of the areas B which deform the least. Moreover at the areas B, because the curvature change is minimal, the mesh size of the mesh-shaped-thin-film 22 changes little and keeps almost the same mesh size as from the beginning. In addition, at the areas C positioned between the areas A and the areas B, this changes at an intermediate change amount to that of the areas A and B. As a result, after the bending step s13, as shown in FIG. 8C, an electromagnetic wave shield window 23 having a mesh-shaped-thin-film 22 which has a uniform mesh size over the whole area of the window member 13 is manufactured.

According to the manufacturing method according to the present embodiment, similarly to the first and the second embodiments, it is possible to manufacture an electromagnetic wave shield window 23 provided with a mesh-shaped-thin-film 22 adhered firmly with no wrinkles to the surface of a window member 13 having a complex curved surface. Therefore, it is possible to effectively shield electromagnetic waves coming from the outside. Furthermore, according to the manufacturing method according to the present embodiment, since the mesh-shaped-thin-film 22 formed on the surface of the window member 13 has a uniform fine mesh size over the whole area, there is the effect that it is possible to manufacture an electromagnetic wave shield window 23 which scatters radio waves in various directions and thus demonstrates a high level radio wave stealth property.

Figure 9:
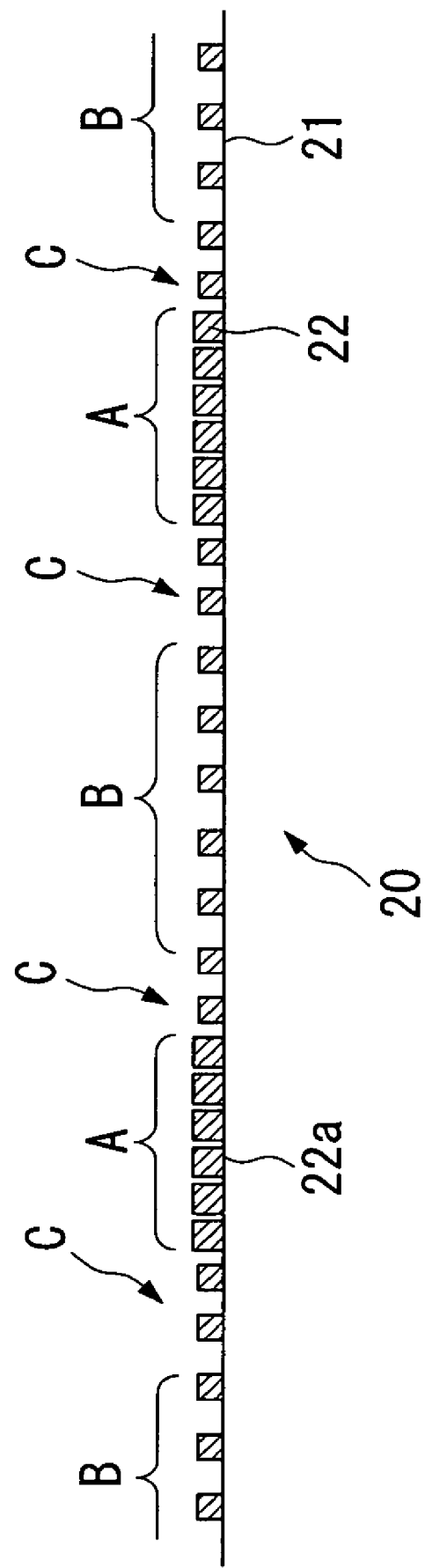
FIG. 9 is a partial sectional view of a modified example of the mesh film shown in FIG. 7.

In addition, while it is shown in the present embodiment that the mesh film 20 has originally different mesh sizes depending on the positions corresponding to the change in of curvature of the window member 13 when being bent, it is preferable that as shown in FIG. 9, the respective mesh lines 22a constituting the mesh-shaped-thin-film 22 also have a variation in thickness. In other words, the respective mesh lines 22a of the mesh-shaped-thin-film 22 positioned at the areas A where the curvature of the window member 13 changes greatly, are preferably formed thicker than respective mesh lines 22a of the mesh-shaped-thin-film 22 positioned at the areas B where the curvature of the window member 13 changes little, because the change amount is greater due to being bent, and when stretched they become thinner. Thus, the mesh shape formed after the bending step S13, has not only a uniform mesh density, but also a uniform thickness for each mesh line 22a constituting the mesh-shaped-thin-film 22. Therefore, there is the effect that the radio wave stealth property can be further enhanced.

What is claimed is:

1. A method of manufacturing a window having at least one of a radio wave stealth property and an electromagnetic wave shield property comprising:

a step for forming a mesh-shaped-thin-film composed of a conductive material on the surface of a flat-shaped transparent window member, and a step for integrally bending the window member and the thin-film, and forming into a curved shape;

wherein in said step for forming a mesh-shaped-thin-film, the thin film positioned in an area where degree of curvature is relatively higher than in other areas of the film in the subsequent bending step, is formed with a finer mesh, and wherein after said step for integrally bending the window member and the thin-film, and forming into a curved shape, the mesh size of the mesh-shaped-thin-film in said area where degree of curvature is relatively higher is equivalent to that in said other areas.

2. A method of manufacturing a window having at least one of a radio wave stealth property and an electromagnetic wave shield property comprising:

a step for forming a mesh-shaped-thin-film composed of a conductive material on the surface of a transparent window member having a single curved surface shape, and a step for integrally bending the window member and the thin-film, and forming into a multiple curved surface shape;

wherein in said step for forming a mesh-shaped-thin-film, the thin film positioned in an area where degree of curvature is relatively higher than in other areas of the film in the subsequent bending step, is formed with a finer mesh, and wherein after said step for integrally bending the window member and the thin-film, and forming into a multiple curved surface shape, the mesh size of the mesh-shaped-thin-film in said area where degree of curvature is relatively higher is equivalent to that in said other areas.

3. A method of manufacturing a window having at least one of a radio wave stealth property and an electromagnetic wave shield property comprising:

a step for forming a mesh-shaped-thin-film composed of a conductive material on the surface of a flat-shaped transparent window member, and a step for integrally bending the window member and the thin-film, and forming into a curved shape;

wherein in said step for forming a mesh-shaped-thin-film, the thin film positioned in an area where degree of curvature is relatively higher than in other areas of the film in the subsequent bending step, is formed with a thicker mesh line, and wherein after said step for integrally bending the window member and the thin-film, and forming into a curved shape, the mesh size of the mesh-shaped-thin-film in said area where degree of curvature is relatively higher is equivalent to that in said other areas.

4. A method of manufacturing a window having at least one of a radio wave stealth property and an electromagnetic wave shield property comprising:

a step for forming a mesh-shaped-thin-film composed of a conductive material on the surface of a transparent window member having a single curved surface shape, and a step for integrally bending the window member and the thin-film, and forming into a multiple curved surface shape;

wherein in said step for forming a mesh-shaped-thin-film, the thin film positioned in an area where degree of curvature is relatively higher than in other areas of the film in the subsequent bending step, is formed with a thicker mesh line, and wherein after said step for integrally bending the window member and the thin-film, and forming into a multiple curved surface shape, the mesh size of the mesh-shaped-thin-film in said area where degree of curvature is relatively higher is equivalent to that in said other areas.

* * * * *